United States Patent [19]

Kitabatake et al.

[11] Patent Number: 4,844,785
[45] Date of Patent: Jul. 4, 1989

[54] METHOD FOR DEPOSITION OF HARD CARBON FILM

[75] Inventors: Makoto Kitabatake, Katano; Kiyotaka Wasa, Nara, both of Japan

[73] Assignee: Matsushita Electric Industrial Co., Ltd., Kadoma, Japan

[21] Appl. No.: 51,798

[22] Filed: May 20, 1987

Related U.S. Application Data

[63] Continuation-in-part of Ser. No. 904,836, Sep. 9, 1986, abandoned, which is a continuation of Ser. No. 716,133, Mar. 26, 1985, abandoned.

[30] Foreign Application Priority Data

| Mar. 27, 1984 | [JP] | Japan | 59-58757 |
| Aug. 2, 1984 | [JP] | Japan | 59-163150 |
| Oct. 2, 1984 | [JP] | Japan | 59-207344 |
| Mar. 5, 1985 | [JP] | Japan | 60-43124 |

[51] Int. Cl.$^4$ ............................................. C23C 14/46
[52] U.S. Cl. .......................... 204/192.11; 204/192.15; 204/298
[58] Field of Search ............. 204/192.11, 192.15, 204/192.22, 192.26, 192.29, 192.31, 192.34; 423/445, 446, 449; 427/35, 38, 39

[56] References Cited

U.S. PATENT DOCUMENTS

| 3,317,354 | 5/1967 | Darrow et al. | 204/173 |
| 3,714,334 | 1/1973 | Vickery | 204/446 |
| 3,890,430 | 6/1975 | Bakul et al. | 423/446 |
| 3,961,103 | 6/1976 | Aisenberg | 423/446 X |
| 4,060,660 | 11/1977 | Carlson et al. | 204/173 X |
| 4,228,142 | 10/1980 | Holcombe, Jr. et al. | 423/446 X |
| 4,256,780 | 3/1981 | Gaerttner et al. | 427/38 |
| 4,425,315 | 1/1984 | Tsuji et al. | 423/446 |
| 4,434,188 | 2/1984 | Kamo et al. | 423/446 X |
| 4,486,286 | 12/1984 | Lewin et al. | 204/192.15 |
| 4,490,229 | 12/1984 | Mirtich et al. | 204/192.15 |

OTHER PUBLICATIONS

C. Neissmantell et al., "Preparation and Properties of Hard i-c and i-BN Coatings", Thin Solid Films, 96 (1982), pp. 31-44.

L. Holland et al., "The Growth . . . Plasma", Thin Solid Films, 58 (1979), pp. 107-116.

G. Gautherin et al., "Some Trends . . . Methods", Thin Solid Films, 50 (1978), pp. 135-144.

Kitabatake et al., "Growth of Diamond at Room Temperature by an Ion-Sputter Deposition Under Hydrogen-Ion Bombardment", Journal of Applied Physics 58 (4), Aug. 15, 1985, pp. 1693-1695.

Primary Examiner—Nam X. Nguyen
Attorney, Agent, or Firm—Cushman, Darby & Cushman

[57] ABSTRACT

A diamond-like hard carbon film is formed on a substrate by impinging particles of carbon onto a surface of the substrate, bombarding the surface of the substrate with accelerated particles of inert gas or particles of carbon together with hydrogen in a direction not more than 10 degrees out of parallel to the surface so that the particles of carbon aggregate on the surface, at room temperature.

6 Claims, 6 Drawing Sheets

- Inert gas
- Carbon

- ○ Inert gas
- ● Carbon

- ● Inert gas
- ● Carbon
- × H or F

- ○ Inert gas
- ○ Carbon
- × H or F

○ Inert gas
● Carbon

METHOD FOR DEPOSITION OF HARD CARBON FILM

REFERENCE TO RELATED APPLICATION

This is a continuation in part of our application Ser. No. 904,836, filed Sept. 9, 1986, and abandoned in favor hereof, which was a continuation of our application Ser. No. 716,133, filed Mar. 26, 1985.

BACKGROUND OF THE INVENTION

1. Field of the Invention

The present invention relates generally to a method for depositing hard carbon film onto a substrate, and especially to such a method in which the hard carbon film is a thin film of diamond crystal and the substrate if os non-diamond material that is kept at low temperature.

2. Description of the Prior Art

In recent years, hard carbon films of diamond or diamond-like films have been studied. Such diamond film and diamond-like films are formed by using the so-called CVD method (hot filament CVD, microwave plasma-assisted CVD, etc.) or the ion-beam method (ion beam deposition, ion beam sputtering, etc.).

In order to make the diamond film by the conventional methods, substrate must be raised to a high temperature of several hundred degrees (°C.). For the application to the semiconductor industry, the diamond thin film should be formed under a low temperature condition (<400° C.). Furthermore, the diamond films formed by conventional methods are polycrystalline and each crystal has randomly-oriented crystal axes. For application to the diamond semiconductor devices, it has been desired that a single crystal diamond film be formed on the substrate which is not diamond.

The conventional processes of making diamond crystal film have problems of necessitating a high temperature and difficulty in controlling the crystal axes of diamond deposited onto the substrate. Heretofore, no one has succeeded in making diamond crystal at room temperature.

There were reports that diamond-like amorphous hard carbon films were obtainable on substrates which were kept at low temperature. FIG. 1 schematically shows, one of the conventional methods for making the diamond-like film, using dual ion beam sputtering apparatus. In using this conventional apparatus, an Ar ion beam 2 is issued from a sputtering ion source 1 and bombards a carbon target 3, from which carbon particles 4 are sputtered and impinge on a substrate 5. On the other hand, another ion beam source 6 issues another Ar ion beam 7 which bombards the surface of the substrate 5. By means of such a dual ion beam sputtering process, a hard carbon film 51 is formed on the surface of the substrate 5. The bombarding ion beam 7 makes carbon particles, which are sputtered from the target 3 and deposit on the substrate 5, into a diamond-like amorphous hard carbon film 51. The mechanism, by which the bombarding substrate with the ion beam 7 produces the desired effect, is not yet revealed so far, but it is known that a use of a bombarding ion beam besides an impinging of carbon particles produces hard carbon film.

The conventional processes of making the diamond-like amorphous film have problems of necessitating a two ion source or special ion source which issued a carbon ion beam, and difficulty in controlling the physical properties of the obtained diamond-like film. The incident angle of the bombarding ion beam on the surface of the substrate have never been considered. These diamond-like films do not contain diamond crystals. Diamond crystals have never been made at room temperature.

SUMMARY OF THE INVENTION

The present inventors have found that by impinging carbon particles onto the surface of the substrate and bombarding the carbon coating thereby formed on the surface with accelerated particles of inert gas or carbon in a direction, which is not more than 10 degrees out of parallel to the surface of the substrate, the carbon particles are made to aggregate on the surface of the substrate, efficiently forming a hard carbon film. The present inventors further have found that by inclusion of hydrogen in accelerated particles in the above-mentioned process, physical properties of the produced hard carbon film can be controlled to a considerable extent as a function of the amount and degree of activation of the hydrogen, and that the diamond-like amorphous hard carbon film containing diamond crystal particles can be made on the substrate in the process at room temperature. These diamond particles exhibit almost same directions of crystal axes, which are affected by direction of the bombarding ion beam. These well-oriented diamond crystals are expected to play an important role in depositing the single crystal diamond film on the non-diamond substrate.

The purpose of the present invention is to provide a hard carbon film of amorphous state, containing diamond crystal particles, at room temperature, on a substrate which is non-diamond. For this purpose, a method for deposition of hard carbon film in accordance with the present invention comprises:

impinging of particles of carbon onto a surface of a substrate, bombarding the surface of the substrate with accelerated particles of inert gas or particles of carbon together with accelerated particles of hydrogen in a direction which is not more than 10 degrees out of paralle to the surface of the substrate, and making the particles of carbon aggregate on the surface of the substrate to form the hard carbon film containing diamond crystal particles at room temperature.

This purpose can be also attained by a variation of the method comprising:

impinging of particles of carbon and particles of hydrogen onto a surface of a substrate, bombarding of the surface of the substrate with accelerated particles of inert gas or particles of carbon in a direction which is not more than 10 degrees out of parallel to the surface of the substrate and making the particles of carbon aggregate on the surface of the substrate to form this hard carbon film containing diamond crystal particles at room temperature.

Another purpose of the present invention is to make a hard carbon film having controlled physical properties.

Another purpose of the present invention is to make diamond particles which exhibit approximately same directions of crystal axes as one another.

Another purpose of the present invention is to make diamond crystals efficiently. This purpose is achievable, for instance, by a method which is a modification wherein the particles of hydrogen among the accelerated bombarding and impinging particles are ionized.

Another purpose of the present invention is to make diamond crystal nuclei and to provide an efficient growing of diamond crystals. For this purpose, particles of at least one metal, which is selected from the group consisting of Fe, Ti, Ni, Rh, Pb, Pt and Co, are impinged on the surface of the substrate in practicing the method, the surface of the substrate is bombarded with the above-mentioned metals, or the surface of the substrate is covered with the thin film of the above-mentioned metals. This purpose can be also attained by a modification wherein the surface of the substrate was grooved in practicing the method.

DETAILED DESCRIPTION OF THE INVENTION

Figure 1:
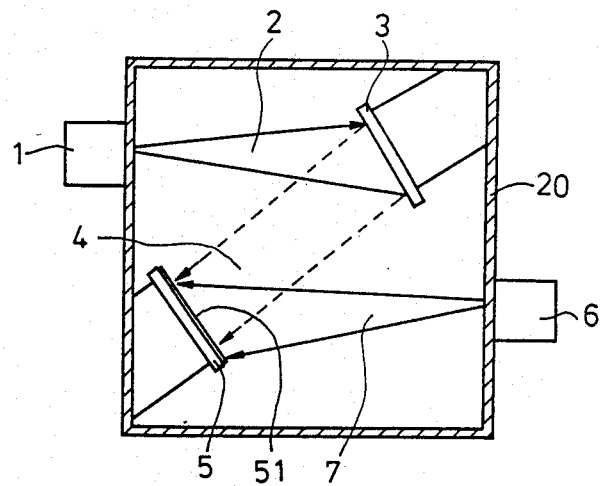
FIG. 1 is the schematic sectional view of conventional apparatus for forming hard carbon film using the dual ion beam sputtering method.
Figure 2A:
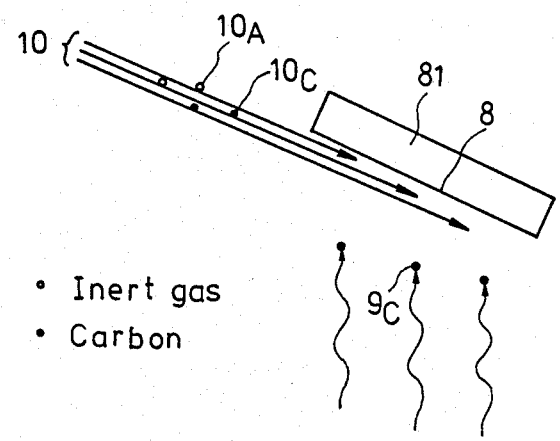
FIG. 2A is an enlarged schematic view showing a process of carrying out a method embodying principles of the present invention.
Figure 7A:
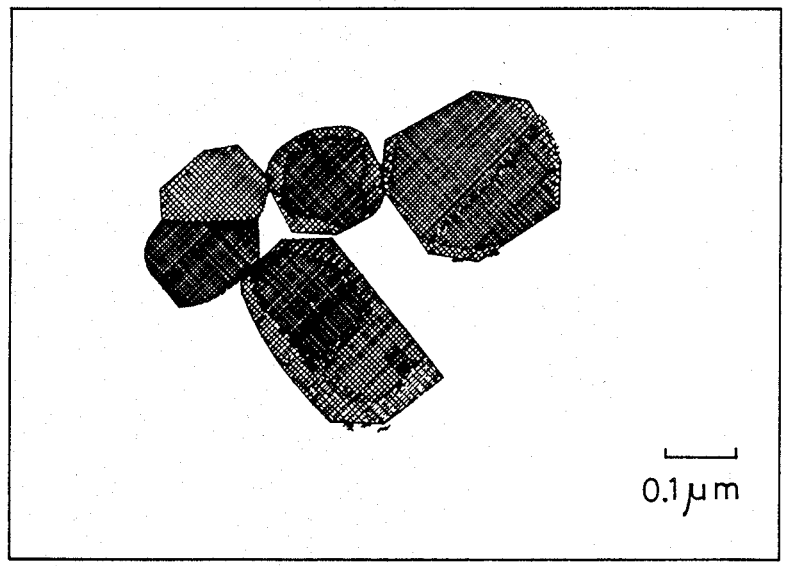
FIG. 7A is a sketch of a microscopic photograph of another sample made embodying principles of the present invention.
Figure 7B:
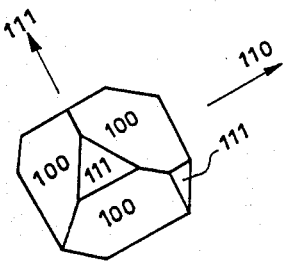
FIG. 7B is an enlarged cross-sectional view showing the substrate with the hard carbon film of FIG. 7A formed thereon.
Figure 8A:
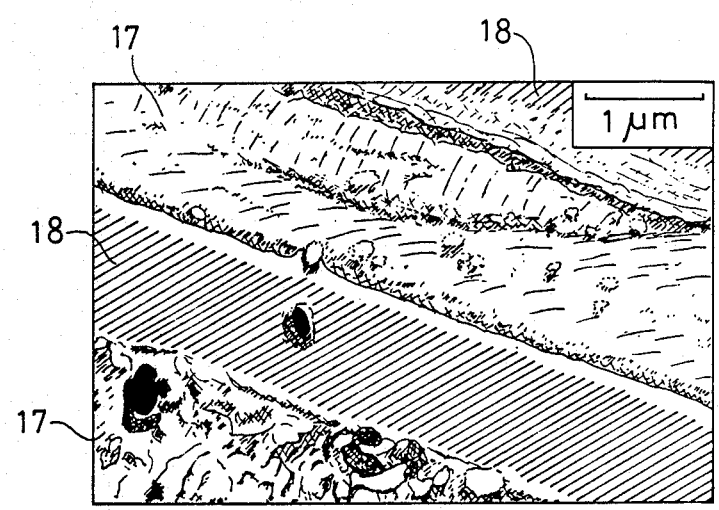
Figure 8B:
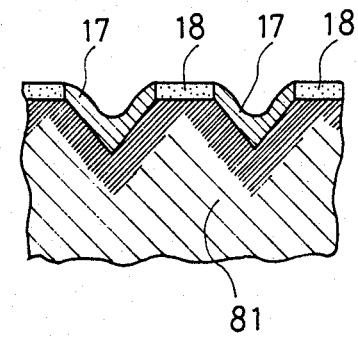

The method in accordance with the present invention is described with reference to the accompanying drawings, particularlary FIG. 2A and through FIG. 7B. FIG. 2A shows a first embodiment wherein a surface 8 of a substrate 81 was fed with impinging particles of carbon $9_C$ and bombarded with particles of accelerated inert gas $10_A$ or carbon $10_C$ in a direction which is not more than 10 degrees out of parallel to the surface of the substrate. The impinging and bombarding particles of carbon were made to aggregate on the surface 8 to form a hard carbon film. This film was in an amorphous state, but had Mohrs' harness of 9 or more.

Figure 2B:
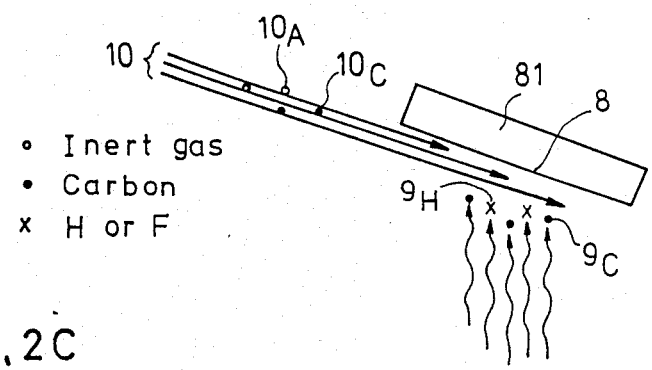
FIG. 2B is an enlarged schematic view showing a modification of the process of carrying out a method emboding principles of the present invention.
Figure 2C:
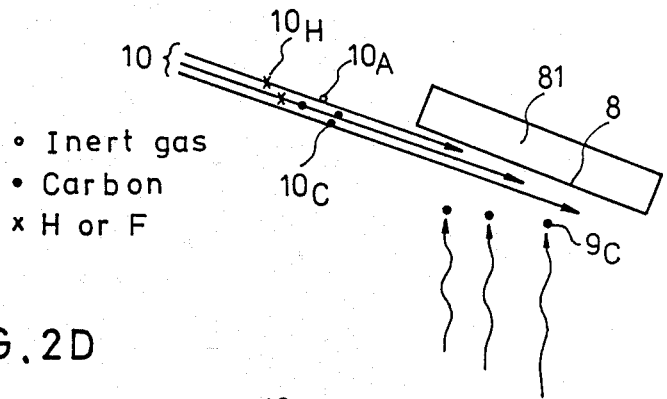
FIG. 2C is an enlarged schematic view showing anther modification of the process of carrying out a method emboding principles of the present invention.

The inventors further experimentally confirmed that when, as shown in FIG. 2B, hydrogen particles $9_H$ impinged on the surface 8 of the substrate 81, and when, as shown in FIG. 2C, the accelerated bombarding particles 10 included hydrogen particles $10_H$, the resultant hard carbon film showed still higher transparency and electric insulation properties than the hard carbon film formed without hydrogen. Furthermore, growing of diamond crystals, each of which exhibited almost the same directions of the crystal axes with each other, in the film was confirmed. It was further confirmed that when the hydrogen particles were ionized, the characteristics, namely, the transparency, insulation and amount of the diamond crystals contained became still better. The electric conductivity or insulation of the film could be adjusted by controlling the amount and degree of activation of hydrogen particles.

Figure 2D:
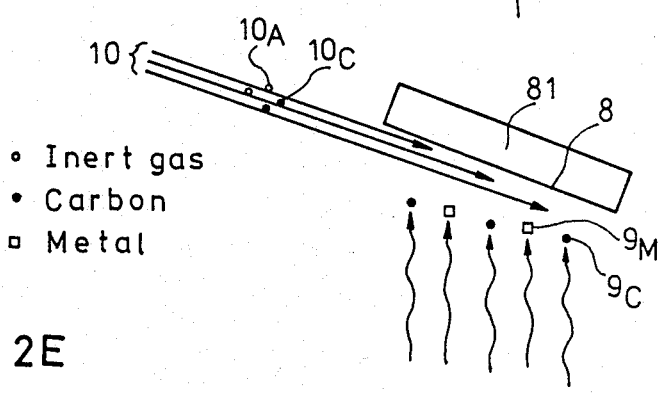
FIG. 2D is an enlarged schematic view showing another modification of the process of carrying out a method emboding principles of the present invention.
Figure 2E:
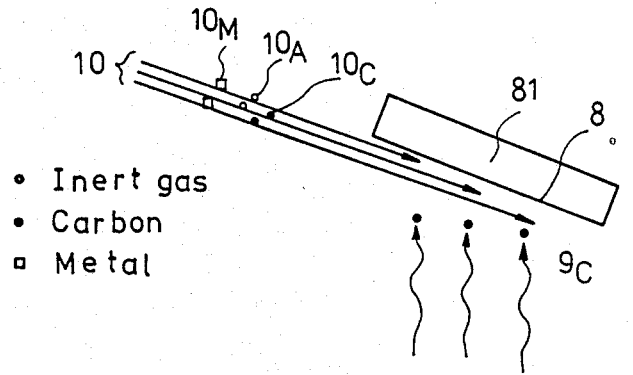
FIG. 2E is an enlarged schematic view showing another modification of the process of carrying out a method emboding principles of the present invention.

When, as shown in FIG. 2D, at least one kind of metal particles $9_M$ selected from a group consisting of Fe, Ti, Ni, Rh, Pd, Pt and Co was supplied onto the surface of the substrate during the deposition, the growth of the diamond crystals was accelerated. When the surface 8 was bombarded with the accelerated metal particles $10_M$ as shown in FIG. 2E, it was confirmed that the growth of the diamond crystals was still accelerated.

The word "impinge" is used to mean that the particles with slow speed motion (<100 eV), mainly induced by thermal activity, land on the surface, come to rest, and remain thereon. The word "bombard" is used to mean that the particles with high speed motion (>100 eV) strike the surface and provide a hard spike to the surface or sputter the particles from the surface. This hard spike contributes to the construction of the diamond structure. The bombardment with energy at >100 eV is the minimum value sufficient to achieve this effect.

The impinging particles were provided mainly by heat evaporation, sputtering from the target or gas-flowing. These impinging particles can be ionized by passing through a plasma region as in ion plating deposition technique.

The bombarding particles were provided mainly by an ion source. The Kaufman-type ion source is well known as a practical ion source. The bombarding particles of inert gas and/or hydrogen were issued from the ion source in which the inert and/or hydrogen gases were led. The bombarding particles of hydrogen and/or carbon were issued using the hydrocarbon gas in the present method. The bombarding particles of carbon and metals were made using a sputtering-type ion source, wherein the carbon or metal target was placed in the discharge region, plasma discharge sputtered the carbon or metal, and then these sputtered carbon or metal particles were ionized and accelerated by an applied voltage.

In case, use of the known above-mentioned ion source, the accelerated high speed particle beam is ionized. The additional use of a neutralizer (such as an electron shower) converts this ionized beam into a neutral particle beam. A change of the plasma discharge condition in the ion source causes a change in the degree of activation of the emitted particles.

Figure 3:
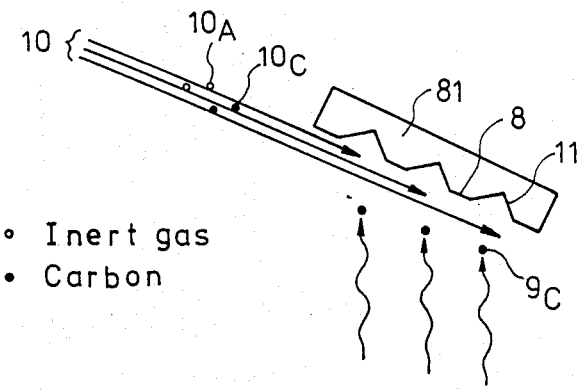
FIG. 3A is an enlarged schematic view showing another modification of the process of carrying out a method emboding principles of the present invention.
FIG. 3B is an enlarged schematic view showing another modification of the process of carrying out a method emboding principles of the present invention.

When the surface 8 of the substrate 81 was formed to have grooves 11 or was covered with the thin film 82 of the above-mentioned metals as shown in FIG. 3A and FIG. 3B, respectively, and the same processes as above-mentioned were carried out thereon, it was confirmed that the growth of diamond crystals was accelerated. The edges of the grooves 11 and the interface between the metal film and the carbon film served as nuclei for the growth of diamond crystals. The grooves were provided by scratching by an etched hard tool or lapping by an abrasive sheet or powder.

Figure 4A:
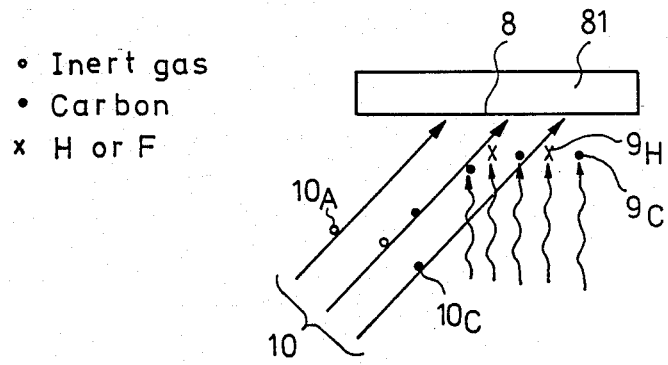
FIG. 4 is an enlarged schematic view showing another modification of the process of carrying out a method emboding principles of the present invention.
Figure 4B:
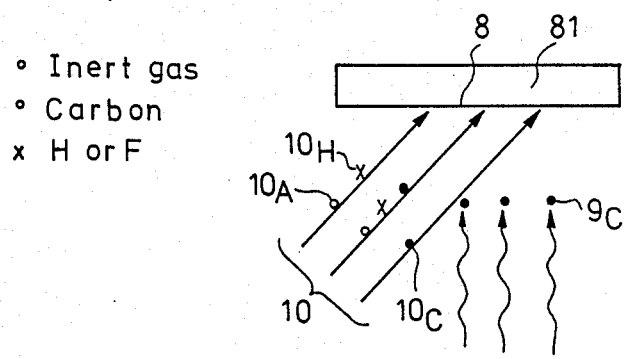

The inventors further confirmed that when a carbon target 14 is bombarded with a high speed particle beam 13 to sputter carbon particles therefrom as shown in FIG. 4, these carbon particles impinge on the surface 8 of the substrate 81 and make a film. Futhermore, by placing the surface 8 of the substrate 81 in such a direction that the surface 8 is bombarded with the high speed accelerated particle beam 13 at a very narrow angle, namely, a direction which is not more than 10 degrees out of parallel to the surface of the substrate, the high speed accelerated particle beam does on one hand sputter carbon particles from the target 14 to supply the carbon particles onto the surface 8 of the substrate 81, and on the other hand bombards the surface 8 of the substrate 81. Therefor, by using a single, high-speed particle beam 13, the impingement and the bombardment may both be carried out. Thus, a hard carbon film including diamond crystals is obtainable by a simple apparatus.

It is supposed that when the carbon particles are aggregated into solid state, at the time of accelerated particle bombardment of inert gas or carbon on the small area of carbon film deposited on the surface 8 of the substrate, the small area bombarded with the particles is raised to a high temperature and high pressure by the collision energy of the bombardment. Thereby, the carbon particles on the surface 8 of the substrate change to diamond in the small area. From a macroscopic point of view, the temperature of the substrate was kept at low temperature. So considered, a hard carbon film containing diamond crystals can be obtained at room temperature by the present method.

It is supposed that the accelerated particles of hydrogen, as well as ionized hydrogen, perform on the surface of the substrate as follows:

removing the part of carbon film which has a non-diamond structure selectively in comparison with that which has a diamond structure, by changing it into a hydrocarbon gas and activating the growth of diamond, making the hydrocarbon cations or radicals which impinge the surface of the substrate and may construct the diamond structure. Making diamond structure from the hydro-carbon cations or radicals may be easier than making diamond structure from the carbon particles. The hydrocarbon cations or radicals were produced effectively by bombarding the carbon target with hydrogen particles. It was experimentally confirmed that the sputtered particles contained the hydrocarbon particles. The hydrogen particles are so light and reactive that they have little collision energy and a high chemical activity. Some hydrogen particles scattered from the carbon target bombard the surface of the substrate with high speed in a direction which is not almost parallel to the surface of the substrate.

The collision effect of the inert gas or carbon particles and the removing effect of the hydrogen particles have the presented direction in the present invention. The direction of these effects affects the direction of crystal axes of diamond crystals observed in the film made by the present invention. The facts are not known in detail.

Figure 5:
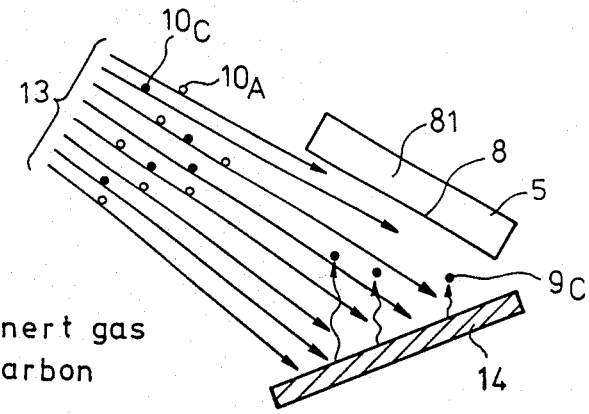
FIG. 5 is a sectional elevational view of an apparatus for forming the hard carbon film in accordance with principles of the present invention.

FIG. 5 is a sectional elevation view of an apparatus for forming the hard carbon film embodying the present invention.

The beam source 12 has a known configuration mentioned above and is emitting particles of argon, if necessary including hydrogen particles. The beam source 12 is connected to an argon gas cylinder 121 and a hydrogen gas cylinder 122, by tubes. A chamber 20 is for providing an evacuated space 201 therein, into which an accelerated particle beam from the beam source 12 is emitted. In the chamber 20, a target 14 is held on a target holder 141. In the embodiment now being described, the target 14 is a pellet of carbon, such as graphite. A substrate 81 is held using a substrate holder 811, in such a manner that a principal surface of the substrate 81 has very narrow angle which is not more than 10 degrees out of parallel to the direction of the particle beam of that place.

The surface of the carbon target is bombarded with the particle beam emitted from the beam source 12 and sputtered, thereby to make carbon paricles which impinge on the surface 8 of the substrate 81. In case impinging of the hydrogen particles on the surface 8 is required, the valve $V_{H1}$ is opened, so that hydrogen gas is led into the space 201. The surface 8 of the substrate 81 is bombarded with a part of the accelerated high speed particle beam in a direction which is not more than 10 degrees out of parallel to the surface of the substrate. When bombardment with the accelerated high speed particle beam including hydrogen particles is intended, it is done by opening a valve $V_{H2}$ to introduce hydrogen gas into the beam source 12.

The bombardment with the accelerated high speed hydrogen particle beam, with the valve $V_{H2}$ open, made the deposited carbon film more transparent, more electrically insulative, and to contain diamond crystal particles. These effects became weak when hydrogen particles impinged the surface of the substrate with the valve $V_{H1}$ open. The bombarding hydrogen which was activated in the ion source exhibited a higher degree of activation than the impinging hydrogen did.

Since the surface 8 of the substrate 81 is placed in a direction which is not more than 10 degrees out of parallel to the particle beam 10, the high speed particles bombard the surface 9 in a manner to graze the surface or sweep over the surface. Since the velocity of the particle beam 10 component normal to the surface 8 of the bombarding particles is low, the substrate 81 is not subject to an undue temperature rise when a particle beam of very high energy(speed) is used. Accordingly, there is no fear of causing an undesirable sputtering of the resultant film or the substrate 81, and bombardment the hard carbon film with the accelerated high speed particle beam is carried out efficiently. Furthermore, the crystal axes of the diamond particles formed onto the surface of the substrate are fixed by the direction of the accelerated particle beam. This effect is only realized when the direction of the particle beam is nearly parallel to the surface of the substrate. If the angle between the surface of the substrate and the particle beam is more than 10 degrees, the resultant film and/or the substrate are sputtered and hard carbon film is not deposited. The optimum angle for this present invention is not more than 10 degrees out of parallel.

Figure 6:
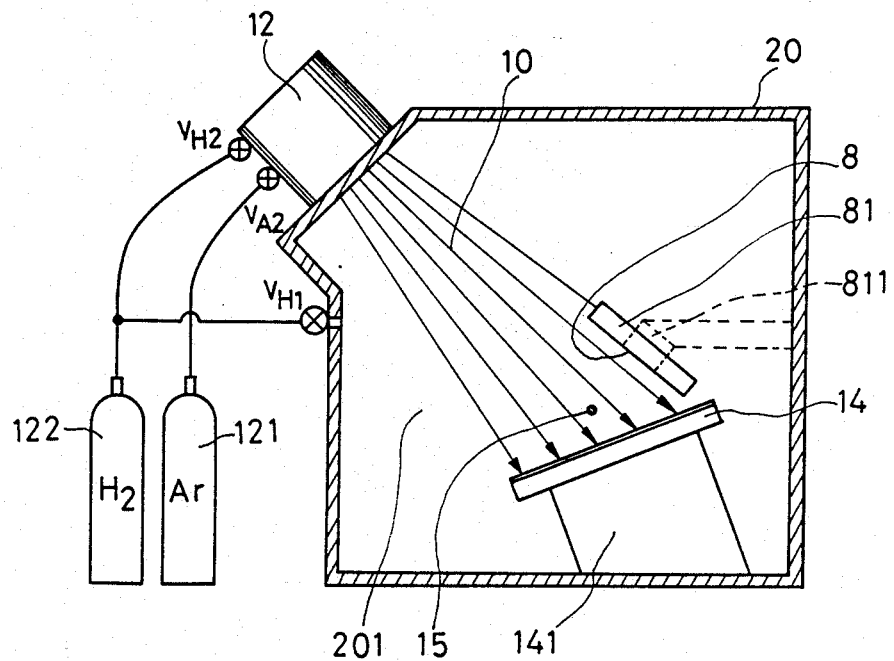
FIG. 6A and FIG. 6B is a sketch of a microscopic photograph of a sample made embodying principles of the present invention.

In one example using the above-mentioned ion beam, an Ar ion beam having an ion energy of 1.2 keV and an ion current of 60 mA is used, and a graphite target 14 of 100 mm in diameter and 5 mm in thickness is used as a target. An Si substrate 81 is disposed as shown in FIG. 6, close to the graphite target 14, and a hard carbon film is formed on the substrate 81. In this embodiment, the deposition rate of the hard carbon film was 2-3 Å/sec. Hardness of the obtained hard carbon film was 9 or more of Mohs hardness, and the film was a so-called diamond-like film. When hydrogen was led into the beam source 12, hence into the ion beam, the specific electrical resistance of the resultant hard carbon film increased by several digits and the transparency of the film become higher. It was further confirmed that when a hydrocarbon such as methane is used in place of hydrogen, a similar effect is obtained. The growth of diamond crystal in the hard carbon film thus obtained was confirmed. That is, the method in accordance with the present invention can grow diamond crystals on a non-diamond substrate held at room temperature.

When at least one metal selected from the group consisting of Fe, Ti, Ni, Rh, Pd, Pt and Co was mixed in the target 14, or a wire 15 made of at least one of these metals was disposed over the surface 8 of the substrate 81, or a thin film made of at least one of those metals was deposited onto the surface of the substrate, each such metal was sputtered and impinged on the surface 8, or made a interfacal mixing region with the carbon film, and accelerated the growth of diamond crystal and the formation of diamond crystal nuclei. By mixing the particles of these metals in the ion beam from the beam source 12, the growth of the diamond crystals and the formation of the diamond crystal nuclei were accelerated. Induction of metal chloride gas into the ion source or the setting of the metal target in the discharge region of the ion source, completed the mixing of the metal particles in the ion beam.

Instead of argon gas, another inert gas such as Ne (neon), He (helium) or Xe (xenon) can be used.

Instead of the ion beam as mentioned above, neutral atoms which are produced by a known neutralizer may be used, and besides, carbon particles instead of the inert gas may be used. The carbon particles are advantageous in that they are themselves the material to make the diamond crystal, they have the necessary mass to constitute diamond at the above-mentioned small areas of carbon particle deposition, and they do not act as an impurity. As a means for supplying carbon particles to impinge on the surface 8 of the substrate, besides the above-mentioned sputtering, thermal vaporization, CVD, electron beam vaporization, laser beam vaporization, or the like can be used.

In the above-mentioned examples, silicon substrates were used as the substrate 81, but any materials which are stable at room temperature may be used. In case a crystal grain of diamond is used as the substrate, growth of diamond crystals thereon is easy. Since there is no need of heating the substrate 81 in the present invention, a material such as plastic sheet may be used as the substrate.

It was confirmed that by using a substrate having grooves 11, which were made by lapping using 1 μm diamond abrasive powder, on the surface 8, diamond crystals were efficiently formed at the edge parts of the grooves. FIG. 6 is a sketch of a microscopic photograph of diamond crystal, FIG. 7A is a sketch of a microscopic photograph of a hard carbon film formed on a surface having grooves and FIG. 7B is a sectional view showing the sectional configuration of part of the sketch shown in FIG. 7A. As shown in FIG. 7B, the hard carbon film formed on the grooved surface of the substrate which was made by lapping using #800 abrasive sheet, comprises diamond crystal structure parts 17, 17 on the grooves and amorphous structure parts 18, 18 on the flat surface parts.

What is claimed is:

1. A method for depositing a hard carbon film onto a surface of a non-diamond substrate, comprising:
   (a) impinging a set of first particles onto a surface of a non-diamond substrate, said first particles including carbon and at least one of hydrogen, hydrogen ions, a metal selected from the group consisting of Fe, Ti, Ni, Rh, Pb, Pt and Co, by causing said first set of particles, having slow speed motion of $<100$ eV mainly inducted by thermal activity, to land on said surface and remain thereon;
   (b) bombarding said surface of said substrate, while conducting step (a), with a second set of second particles including at least one of neutral particles and ions, of at least one of inert gas, carbon, hydrogen and a metal selected from the group consisting of Fe, Ti, Ni, Rh, Pb, Pt and Co, by causing said second set of particles to strike said surface with high speed motion of $>100$ eV in an accelerated particle beam, at an angle which is not more than 10 degrees out of parallel with said surface of said substrate;
   wherein at least one of said first and second sets of particles includes at least one of hydrogen and hydrogen ions,
   whereby particles of carbon are aggregated on said surface of said substrate to form a hard carbon film containing diamond crystals, while said substrate, considered as a whole, remains substantially at room temperature.

2. The method of claim 1, wherein:
   when steps (a) and (b) are begun, said surface exists as a grooved surface.

3. The method of claim 1, wherein:
   step (b) comprises sputtering a carbon target by an accelerated particle beam.

4. The method of claim 1, further including:
   a step of coating said surface with at least one metal selected from the group consisting of Fe, Ti, Ni, Rh, Pb, Pt and Co during conducting steps (a) and (b).

5. The method of claim 1, wherein:
   said inert gas is selected from the group consisting of argon, neon, helium and xenon.

6. The method of claim 1, wherein:
   the second particles include hydrogen ion and the diamond crystals have non-randomly oriented crystal axes which are generally aligned in relation to said accelerated particle beam.

* * * * *